(12) United States Patent
Takaoka

(10) Patent No.: US 8,815,474 B2
(45) Date of Patent: Aug. 26, 2014

(54) PHOTOMASK DEFECT CORRECTING METHOD AND DEVICE

(75) Inventor: Osamu Takaoka, Chiba (JP)

(73) Assignee: Hitachi High-Tech Science Corporation (JP)

( * ) Notice: Subject to any disclaimer, the term of this patent is extended or adjusted under 35 U.S.C. 154(b) by 0 days.

(21) Appl. No.: 13/601,028

(22) Filed: Aug. 31, 2012

(65) Prior Publication Data

US 2012/0328974 A1 Dec. 27, 2012

Related U.S. Application Data

(63) Continuation-in-part of application No. 12/733,090, filed as application No. PCT/JP2008/064121 on Aug. 6, 2008, now Pat. No. 8,257,887.

(30) Foreign Application Priority Data

Aug. 10, 2007 (JP) .................................. 2007-210362

(51) Int. Cl.
*G03F 1/72* (2012.01)
*G03F 1/74* (2012.01)

(52) U.S. Cl.
USPC .............................. 430/5; 250/309; 250/492.3

(58) Field of Classification Search
USPC .............. 430/5, 30; 250/492.2, 492.22, 492.3
See application file for complete search history.

(56) References Cited

U.S. PATENT DOCUMENTS

| 6,467,426 | B1 | 10/2002 | Takaoka et al. | ................ 118/723 |
| 2002/0096635 | A1 | 7/2002 | Takaoka et al. | ................ 250/306 |
| 2004/0131953 | A1 | 7/2004 | Sugiyama et al. | ................ 430/5 |
| 2008/0020298 | A1 | 1/2008 | Nagamura et al. | ................ 430/5 |

FOREIGN PATENT DOCUMENTS

| JP | 61113234 | 5/1986 |
| JP | 2000098591 | 4/2000 |
| JP | 2005189492 | 7/2005 |
| JP | 2006350219 | 12/2006 |
| TW | 432254 | 5/2001 |
| TW | 582091 | 4/2004 |

*Primary Examiner* — Stephen Rosasco
(74) *Attorney, Agent, or Firm* — Adams & Wilks

(57) ABSTRACT

A photomask defect correction method and device correct an opaque or a clear defect of a photomask. An opaque or clear defect in a portion of a photomask to be corrected is observed and information of the observed defect for performing correction of the defect is acquired. The observed defect is corrected in accordance with the acquired defect information by irradiating the observed defect with a focused ion beam from an ion beam irradiation system having a gas field ion source that generates gas ions for forming the focused ion beam. The gas ions may be hydrogen ions, nitrogen ions, oxygen ions, fluorine ions or chlorine ions.

10 Claims, 8 Drawing Sheets

US 8,815,474 B2

PHOTOMASK DEFECT CORRECTING METHOD AND DEVICE

CROSS-REFERENCE TO RELATED APPLICATIONS

This application is a continuation-in-part of application Ser. No. 12/733,090 filed Mar. 19, 2010, now U.S. Pat. No. 8,257,887 which is a U.S. national stage application of International Application No. PCT/JP2008/064121 filed Aug. 6, 2008, claiming a priority date of Aug. 10, 2007, and published in a non-English language, all of which are incorporated herein by reference.

BACKGROUND OF THE INVENTION

1. Technical Field

The present invention relates to a photomask defect correcting method and device.

Priority is claimed on Japanese Patent Application No. 2007-210362, the content of which is incorporated herein by reference.

2. Related Art

Conventionally, as a defect correcting method and device used for correcting a defect of a photomask, a method and device are known for performing correction of a opaque defect and correction of a clear defect using an etching capability of a minute region using a focused ion beam and an ion beam-induced chemical vapor deposition capability. As the focused ion beam, gallium ion beam using a liquid metal gallium ion source has been used. However, a Ga ion is opaque with respect to light which has a wavelength of 193 nm and is currently used for exposing a leading-edge mask. Accordingly, since the Ga ion is injected into a glass or quartz substrate which is a light transmission portion, transmissivity of the light transmission portion is decreased and thus there is the deterioration in the optical characteristics of a defect correction point or an observed region.

The injected Ga ions can be removed to some degree by wet cleaning, but cannot be completely removed if the injection amount thereof is large. Accordingly, there is a restriction in the number of observations, and additional processing in the vicinity of a correction point has been difficult. That is, since the Ga ions are injected and accumulated whenever an observation is performed (the ion bean is scanned), after cleaning, a restriction is set on the number of observations so that the Ga ions are not accumulated to a degree that the necessary transmissivity cannot be obtained. In addition, additional processing is performed where a region including a defect is once more observed after the correction of the defect and an uncut portion or a loss portion of the defect is recorrected or a removing reattachment is performed. However, although a shape is improved due to the additional processing, the injection amount of the Ga ions is increased because the observation is performed once more and additional processing is performed. Thus, even when cleaning is performed, the Ga ions are accumulated to a degree that the transmissivity is not recovered.

In addition, since the used wet cleaning removes the Ga ions by selectively cutting glass or quartz of a Ga-ion injection portion (see Non-Patent Document 1), the glass or quartz is scrapped by being cleaned a plurality of times such that there is a phase difference between a scrapped portion and a portion that is not scrapped. Thus, since the optical characteristics of a light transmission portion deteriorate, it is difficult to perform recorrection.

Non Patent Citation 1: Y. Itou et al., "Proc. of SPIE", (US), 2005, 5992, p. 59924 Y-1-59924 Y-8

In a photomask defect correcting method and device using a conventional liquid metal ion source, there is a problem that the transmissivity of the light transmission portion is deteriorated by the injection of the Ga ions and there is a restriction in that additional processing cannot be performed in order to avoid the deterioration of the transmissivity.

In order to avoid the injection of the Ga ions to the transmission portion when correcting the defect, for example, an electron beam may be used. However, when using an electron beam, a sample is apt to be charged up and processing efficiency is bad.

SUMMARY OF THE INVENTION

The present invention has been devised to solve the above-described problems. An object of the present invention is to provide a photomask defect correcting method and device, which are capable of rapidly and highly precisely correcting a defect of the photomask without deteriorating the optical characteristics of the mask.

In order to solve the above-described problems, according to one aspect the present invention, there is provided a photomask defect correction method, which corrects a defect of the photomask, the defect correction method including: an observation process of observing the defect of a portion to be corrected and acquiring defect information for performing correction; and a defect correction process of irradiating a focused ion beam formed of gas ions and generated by an ion beam irradiation system including a gas field ion source (GFIS) (also referred to as an electric field ionized gas ion source) to the portion to be corrected and correcting the defect.

According to the present invention, since the focused ion beam formed of gas ions is irradiated to the portion to be corrected having the defect by the ion beam irradiation system including the gas field ion source based on the defect information acquired in the observation process, it is possible to correct the defect.

Since the ion beam irradiation system includes the gas field ion source for narrowing the beam diameter, for example, compared with the case where a plasma type ion source is used, it is possible to perform minute processing.

Since the focused ion beam is composed of gas ions, even when the focused ion beam is injected into the light transmission portion of the portion to be corrected, the transmissivity thereof is not decreased with respect to an exposure wavelength (ultraviolet light having a wavelength of 193 nm) with a short wavelength. As in case of using the Ga ion source, it is possible to correct the defect of the photomask without deteriorating the optical characteristics.

Since the rare gas ion has a mass larger than that of the electron, for example, compared with the case where the electron beam is used, it is possible to improve processing efficiency.

The photomask defect correction method according to the present invention may include, between the observation process and the defect correction process, a gas selection process of selecting any one of etching rate-increasing gas for correcting a opaque defect of the portion to be corrected or light-shielding film material gas for correcting a clear defect of the portion to be corrected based on the defect information acquired in the observation process, and, in the defect correction process, the defect correction is performed by irradiating the focused ion beam while supplying the etching rate-increasing gas to the vicinity of the opaque defect of the portion to be corrected or the light shielding film material gas to the vicinity of the clear defect of the portion to be corrected.

The photomask defect correction method according to the present invention may further include a charge neutralization process of irradiating an electron beam to the portion to be corrected so as to perform charge neutralization simultaneously with the defect correction process or after the defect correction process.

If the focused ion beam formed of gas ions is irradiated in the defect correction process, the portion to be corrected is positively charged up. Thus, the electron beam can be irradiated to the portion to be corrected so as to perform charge neutralization.

In the related art in which the electron beam is irradiated so as to perform defect correction, since the portion to be corrected is negatively charged up, a positive ion beam is irradiated so as to perform charge neutralization. However, if positive ions having a large molecular weight are irradiated, the portion to be corrected is excessively trimmed by sputter effect. In contrast, in the present invention in which the electron beam is irradiated so as to perform charge neutralization, it is possible to prevent the portion to be corrected from being excessively trimmed.

The photomask defect correction method according to the present invention includes a shape information acquiring process of acquiring shape information on the portion to be corrected after the observation process, the gas selection process and the defect correction process are sequentially repeated one time or more; and a transfer simulation process of performing transfer simulation and determining whether or not the correction is properly performed from the shape information on the portion to be corrected acquired in the shape information acquiring process, and the observation process, the gas selection process and the defect correction process may be sequentially repeated until it is determined that the correction is properly performed by the transfer simulation process.

In this case, after the observation process, the gas selection process for opaque defect correction or clear defect correction, and the defect correcting process are sequentially repeated one time or more, shape information on the portion to be corrected is acquired by the shape information acquiring process and transfer simulation is performed by the transfer simulation process based on the shape information acquired in the shape information acquiring process. Therefore, it is possible to determine whether or not the correction is properly performed.

If the result of correcting the defect is determined by the transfer simulation with high precision, the ion beam irradiation system including the gas field ion source used in the defect correction process has high processing resolution. In addition, since transparent gas ions, such as rare gas ions and non-rare gas ions such as hydrogen, nitrogen, oxygen, fluorine and chlorine gas ions, are used with respect to light having a wavelength of 193 nm, the transmissivity of the portion to be corrected does not deteriorate and thus the reliability of the shape information acquired in the shape information acquiring process is high. As a result, it is possible to improve predicted precision of the transfer simulation.

In addition, in the related art for irradiating the Ga ion beam so as to perform defect correction, since the transmissivity of the portion to be corrected deteriorates due to the Ga ion injection, an error between a transferred image calculated by the transfer simulation based on the numerical calculation using the shape information obtained from the image of the focused ion beam and the actual transferred image is increased. To this end, it needs to be determined whether or not the correction is properly determined using the transfer simulation microscope at the time of the defect correction.

In contrast, in the present invention in which the gas ion beam is irradiated so as to perform defect correction, since the transfer simulation microscope may not be used in all the defect correction processes, it is possible to rapidly perform the defection correction.

In the photomask defect correction method according to the present invention, the shape of the portion to be corrected may be checked by a transfer simulation microscope when it is determined that a proper corrected result is obtained by the transfer simulation process. In this case, since it is finally determined whether the correction is properly performed by the transfer simulation microscope after it is determined that the correction is properly performed, it is possible to improve correction reliability.

In the photomask defect correction method according to the present invention, the observation process, the gas selection process and the defect correction process may be sequentially performed two times or more, in the gas selection process of a first time out of the two times, the etching rate-increasing gas for correcting the opaque defect may be selected and, in the defect correction process of the first time, the defect correction for over-etching the opaque defect may be performed, and, in the gas selection process of a subsequent time out of the two times, gas for forming an ion beam-induced chemical vapor deposition transparent film may be selected as the light shielding film material gas for correcting the portion over-etched in the first time and, in the defect correction process of the subsequent time, the defect correction for filling the over-etched portion may be performed.

In the photomask defect correction method according to the present invention, the gas selection process of the first time is not performed, and the defect correction for over-etching the opaque defect is preferably performed by irradiating the focused ion beam without supplying the etching rate-increasing gas in the defect correction process of the first time.

In the related art in which the electron beam is irradiated so as to correct the opaque defect, since the electron beam itself does not have the sputter effect, the etching rate-increasing gas is always required and thus etching may not be performed according to the material of the portion to be corrected. In contrast, if the focused ion beam is irradiated so as to correct the opaque defect, even when the etching rate-increasing gas is not supplied or even when any material is used as the portion to be corrected, etching can be performed by the physical sputter effect.

In the photomask defect correction method according to the present invention, the observation process, the gas selection process and the defect correction process may be sequentially performed two times or more, in the gas selection process of a first time out of the two times, the light-shielding film material gas for forming an ion beam-induced chemical vapor deposition transparent film with transparency and a phase may be selected in order to correct a clear defect of a phase shift mask and, in the defect correction process of the first time, the defect correction for forming the transparent phase film in the clear defect of the phase shift mask may be performed, and, in the gas selection process of a subsequent time out of the two times, the light-shielding film material gas for forming an ion beam-induced chemical vapor deposition halftone light-shielding film without a phase may be selected and, in the defect correction process of the subsequent time, the defect correction for forming the halftone light-shielding film on the transparent phase film formed in the defect correction process of the first time may be performed.

In the photomask defect correction method according to the present invention, the observation process and the defect correction process may be sequentially performed two times or more, in the defect correction process of two times, the defect correction may be performed by irradiating the focused ion beam without supplying the etching rate-increasing gas, in the defect correction process of a first time out of the two times, when a halo of a light-shielding film is generated, in the defect correction process of a subsequent time out of the two times, the defection correction for trimming the halo as the opaque defect may be performed.

In the related art in which the electron beam is irradiated so as to correct the opaque defect, since the electron beam itself does not have the sputter effect, the etching rate-increasing gas is always required and thus etching may not be performed according to the material of the portion to be corrected. In contrast, if the focused ion beam is irradiated so as to correct the opaque defect, even when the etching rate-increasing gas is not supplied or even when any material is used as the portion to be corrected, etching can be performed by the physical sputter effect.

In the photomask defect correction method according to the present invention, the observation process, the gas selection process and the defect correction process may be sequentially performed two times or more, in the defect correction process of a first time out of the two times, when a halo of a light-shielding film is generated, in the gas selection process of a subsequent time out of the two times, the etching rate-increasing gas for trimming the halo may be selected and, in the defect correction process of the subsequent time, the defection correction for trimming the halo as the opaque defect may be performed.

In the photomask defect correction method according to the present invention, the observation process and the defect correction process may be sequentially performed two times or more, in the defect correction process of two times, the defect correction may be performed by irradiating the focused ion beam without supplying the etching rate-increasing gas, in the defect correction process of a first time out of the two times, the defect correction of the opaque defect may be performed and, when there is reattachment of the opaque defect to another portion is generated such that a reattachment portion is formed, in the defect correction process of a subsequent time out of the two times, the defection correction for trimming the reattachment portion as the opaque defect may be performed.

In the related art in which the electron beam is irradiated so as to correct the opaque defect, since the electron beam itself does not have the sputter effect, the etching rate-increasing gas is always required and thus etching may not be performed according to the material of the portion to be corrected. In contrast, if the focused ion beam is irradiated so as to correct the opaque defect, even when the etching rate-increasing gas is not supplied or even when any material is used as the portion to be corrected, etching can be performed by the physical sputter effect.

In the photomask defect correction method according to the present invention, the observation process, the gas selection process and the defect correction process may be sequentially performed two times or more, in the defect correction process of a first time out of the two times, the defect correction of the opaque defect may be performed and, when there is reattachment of the opaque defect to another portion of the portion to be corrected such that a reattachment portion is formed, in the gas selection process of a subsequent time out of the two times, the etching rate-increasing gas for trimming the reattachment portion may be selected and, in the defect correction process of the subsequent time, the defection correction for trimming the reattachment portion as the opaque defect may be performed. In the photomask defect correction method according to the present invention, in the observation process, the focused ion beam generated by the ion beam irradiation system may be irradiated to the portion to be corrected, secondary charged particles radiated from the portion to be corrected may be detected, and an image of the portion to be corrected may be acquired.

In this case, since the ion beam irradiation system as the correction unit of the defect correction process may function as the observation unit of the observation process, it is possible to rapidly perform conversion of the observation process and the defect correction process.

In the photomask defect correction method according to the present invention, the focused ion beam may be formed of rare gas ions, or non-rare gas ions such as hydrogen, nitrogen, oxygen, fluorine or chlorine gas ions.

In the case of using rare gas ions, a rare gas having a large mass is advantageous in etching. However, in the gas field ion source, it is difficult to extract or pull out the ion beam as the mass is increased. In addition, krypton (Kr) and xenon (Xe) do not obtain practical beam currents. Helium (He) and neon (Ne) can be pulled out from the gas field ion source, but are disadvantageous in terms of an etching rate due to their light weight. Accordingly, if the processing is performed using the ion beam obtained from the gas field ion source, argon (Ar) becomes a preferable ion source with a balance between practicality and etching capability.

When using non-rare gas ions for forming the focused ion beam, hydrogen (H), nitrogen (N), oxygen (O), fluorine (F) and chlorine (Cl) can be used. These gases are transparent to light having a wavelength of 193 nm (ultraviolet light) so that the optical characteristics of glass substrates repaired by these gas ion beams can be properly maintained. Hydrogen, nitrogen and oxygen are preferable to halogen gases such as fluorine and chlorine because they do not need an anti-corrosion coating for the ion beam column. Nitrogen and oxygen each has a larger mass than hydrogen and therefore the processing efficiency of a nitrogen or oxygen ion beam is higher than that of a hydrogen ion beam. Accordingly, nitrogen or oxygen is preferable to hydrogen for the ion source gas.

According to the present invention, there is provided a photomask defect correction device which corrects a defect of the photomask using a focused ion beam, the defect correction device including: an ion beam irradiation system which has a gas field ion source for generating gas ions and which irradiates a focused ion beam toward a photomask portion having a opaque defect or a clear defect to be corrected; an etching rate-increasing gas supply system for correcting a opaque defect of the photomask and a light-shielding film material gas supply system for correcting a clear defect of the photomask; a detector which detects secondary charged particles generated from the portion to be corrected by the focused ion beam irradiated by the ion beam irradiation system; and an image acquiring unit which acquires an image of the portion to be corrected based on an output of the detector.

According to this invention, a photomask defect correction device capable of using the photomask defect correction method of the present invention is provided. To this end, the same effects as the photomask defect correction method of the present invention are obtained.

The photomask defect correction device according to the present invention may include an electron beam irradiation unit which irradiates an electron beam to the portion to be corrected to perform charge neutralization. If the focused ion beam formed of gas ions is irradiated, since the portion to be corrected is positively charged up, the electron beam is irradiated from the electron beam irradiation unit to the portion to be corrected so as to perform charge neutralization.

In the related art in which the electron beam is irradiated to perform defect correction, since the portion to be corrected is negatively charged up, a positive ion beam is irradiated to perform charge neutralization. However, if positive ions having a large molecular weight are irradiated, the portion to be corrected is excessively trimmed by sputter effect. In contrast, in the present invention in which the electron beam is irradiated to perform charge neutralization, it is possible to prevent the portion to be corrected from being excessively trimmed.

The photomask defect correction device according to the present invention may further include a transfer simulation unit which acquires shape information on the portion to be corrected from the image of the portion to be corrected acquired by the image acquiring unit, performs transfer simulation calculation based on the shape information, and determines whether or not the correction of the portion to be corrected is properly performed.

According to the photomask defect correction method and device of the present invention, since the focused ion beam formed of gas ions is irradiated to the portion to be corrected by the ion beam irradiation system including the gas field ion source so as to perform the defect correction, the following effects are obtained. The transmissivity of the portion to be corrected does not deteriorate by the irradiation of the focused ion beam. To this end, since the ion injection portion does not need to be removed in processing afterwards, it is possible to rapidly perform the correction. In addition, since the beam spot diameter is small, it is possible to perform the correction with high precision. The gas ion beam has the advantages of being able to repair a phase shift mask having a phase shift film mainly consisting of the same material as the glass substrate, such as $SiO_2$. The gas ion beam can obtain higher contrast images between materials in the sample than the electron beam. Therefore, the phase shift mask of which a contrast image cannot be obtained by the electron beam, can be repaired precisely by the gas ion beam.

Figure 1:
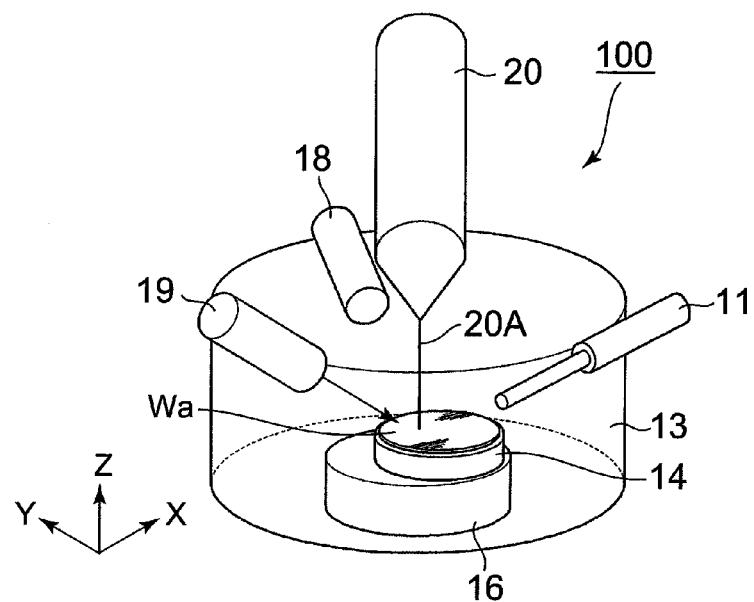
FIG. 1 is a schematic perspective view showing the schematic configuration of a defect correcting device according to an embodiment of the present invention.

EXPLANATION OF REFERENCE CHARACTERS 1, 1A, 1B: LIGHT SHIELDING FILM PATTERN PORTION
2: GLASS SUBSTRATE
3: OPAQUE DEFECT
3a: REATTACHMENT PORTION
4: GROOVE
5A, 7A, 8A: DEPOSITION GAS (LIGHT SHIELDING FILM MATERIAL GAS FOR CORRECTING CLEAR DEFECT)
5B: TRANSPARENT FILM
6: CLEAR DEFECT
7B; TRANSPARENT PHASE FILM
8B: LIGHT SHIELDING FILM
9: DEFECT CORRECTING FILM
9a: HALO
10: ETCHING GAS (ETCHING RATE-INCREASING GAS)
11: GAS GUN
18: SECONDARY CHARGED PARTICLE DETECTOR (DETECTION UNIT)
19: ELECTRON GUN FOR CHARGE NEUTRALIZATION
20: ION BEAM IRRADIATION SYSTEM
20A: ION BEAM (FOCUSED ION BEAM)
21: GAS FIELD ION SOURCE
22: EMITTER
23: EXTRACTION ELECTRODE
24: COOLING DEVICE
25: ION OPTICAL SYSTEM
26: GAS SUPPLY SOURCE (GAS SUPPLY SYSTEM)
26m: ARGON (AR) ATOM
27: POWER SOURCE
30: CONTROL DEVICE
100: DEFECT CORRECTING DEVICE
WA: SAMPLE (PHOTOMASK)

DETAILED DESCRIPTION OF THE PRESENT INVENTION

Hereinafter, exemplary embodiments of the present invention will be described with reference to the accompanying drawings.

First, a photomask defect correcting device according to the present embodiment will be described.

Figure 2:
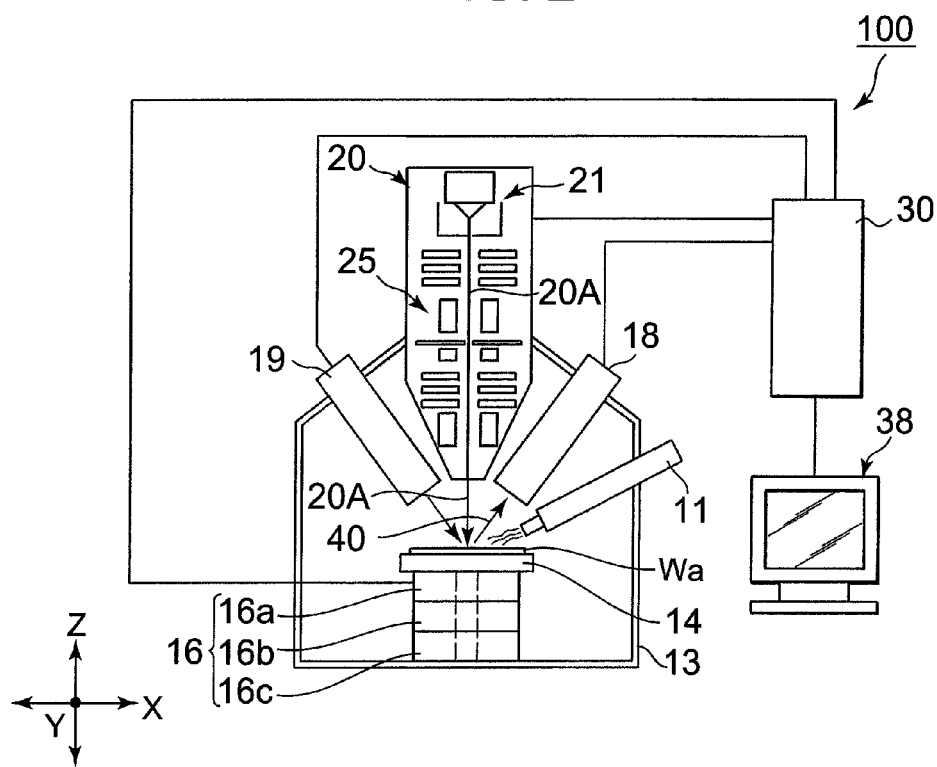
FIG. 2 is a schematic cross-sectional view showing the schematic configuration of the defect correcting device according to the same embodiment.
Figure 3:
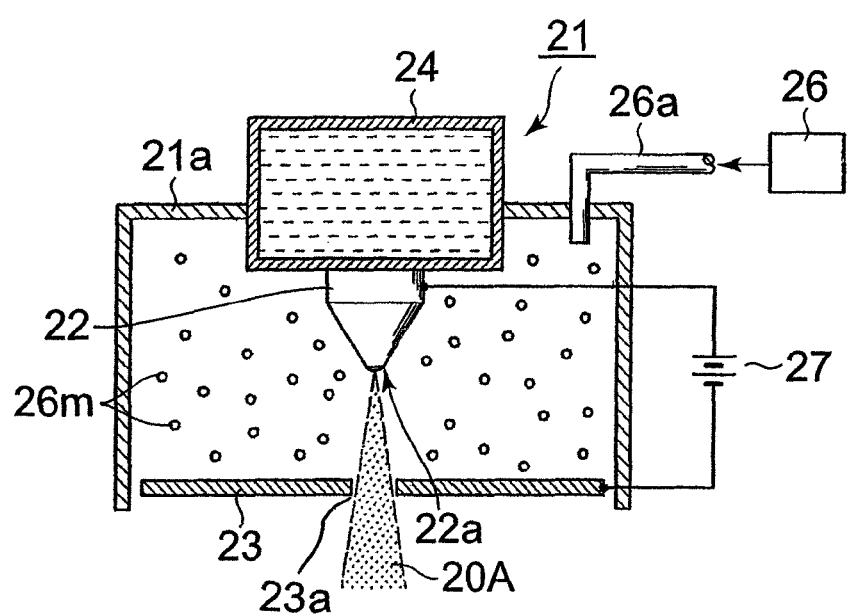
FIG. 3 is a schematic cross-sectional view showing the schematic configuration of a gas field ion source used in the defect correcting device according to the same embodiment.

FIG. 1 is a schematic perspective view showing the schematic configuration of the defect correcting device according to the present embodiment. FIG. 2 is a schematic cross-sectional view showing the schematic configuration of the defect correcting device according to the present embodiment. FIG. 3 is a schematic cross-sectional view showing the schematic configuration of a gas field ion source used in the defect correcting device according to the present embodiment.

As shown in FIGS. 1 and 2, the defect correcting device 100 according to the present embodiment includes an ion beam irradiation system 20, a sample stage 16, a vacuum chamber 13, a secondary charged particle detector 18 (detection unit), a gas gun 11, and an electron gun 19 for charge neutralization. The inside of the vacuum chamber 13 can be depressurized to a predetermined vacuum degree, and some or all of the above components are disposed in the vacuum chamber 13.

The ion beam irradiation system 20 has a focused ion beam lens barrel and irradiates an ion beam 20A to a sample Wa laid on the sample stage 16 disposed in the vacuum chamber 13. The sample Wa is composed of a photomask to be corrected.

The schematic configuration of the ion beam irradiation system 20 includes a gas field ion source 21 for generating and emitting ions and an ion optical system 25 for converting ions emitted from the gas field ion source 21 into an ion beam 20A which is a focused ion beam.

As shown in FIG. 3, the gas field ion source 21 includes an ion generation chamber 21a, an emitter 22, an extraction electrode 23, and a cooling device 24. The cooling device 24 is mounted on a wall of the ion generation chamber 21a, and a needle-like emitter 22 is mounted on a surface of the cooling device 24 facing the ion generation chamber 21a. The cooling device 24 cools the emitter 22 by a cooling medium such as liquid nitrogen or the like contained therein. In addition, the extraction electrode 23 having an opening 23a is disposed at a position facing a front end 22a of the emitter 22 in the vicinity of an opened end of the ion generation chamber 21a.

The inside of the ion generation chamber 21a is maintained in a desired high vacuum state using an exhauster (not shown). gas supply source 26 is connected to the ion generation chamber 21a via a gas introduction pipe 26a and a small amount of ion source gas (for example, Ar gas) is supplied into the ion generation chamber 21a.

In accordance with the present invention, the gas supplied from the gas supply source 26 to the gas field ion source 21 is not limited to Ar gas, and rare gases such as helium (He), neon (Ne), krypton (Kr) or xenon (Xe) and non-rare gases such as hydrogen (H), nitrogen (N), oxygen (O), fluorine (F) or chlorine (Cl) may be used. In addition, plural types of gases may be configured to be supplied from the gas supply source 26 such that the gas type is changed or one or more gas types are mixed according to the use of the ion beam irradiation system 20.

The beam diameter of the ion beam consisting of one kind of gas is smaller than that of the ion beam consisting of mixed gas from two or more kinds of gases. The mixed gas ion beams are focused to different position on the surface of the sample through different trajectories with different masses. Accordingly, it is preferable to supply only one type of gas to the ion gas field ion source 21.

The emitter 22 is a member obtained by coating a needle-like base formed of tungsten or molybdenum with noble metal such as platinum, palladium, iridium, rhodium or gold, and the front end 22a thereof is sharpened at an atom level so as to have a pyramid shape. In addition, the emitter 22 is maintained at a low temperature of about 78° K or less by the cooling device 24 during the operation of the ion source. A voltage is applied between the emitter 22 and the extraction electrode 23 by a power source 27.

If the voltage is applied between the emitter 22 and the extraction electrode 23, a significantly large electric field is generated in the sharpened front end 22a and Ar atoms 26m polarized and attracted to the emitter 22 lose electrons by tunneling at a position having a high electric field of the front end 22a so as to become Ar ions (rare gas ions) (electric field ionization). These Ar ions are repelled by the emitter 22 held at a positive potential and fly to the extraction electrode 23 such that the Ar ions emitted from the opening 23a of the extraction electrode 23 to the ion optical system 25 configure the ion beam 20A.

Since the front end 22a of the emitter 22 has an extremely sharpened shape and the Ar ions run out from the front end 22a, the energy distribution width of the ion beam 20A emitted from the gas field ion source 21 is extremely narrow and an ion beam having a small beam diameter and high luminance can be obtained, for example, compared with a plasma type gas ion source or a liquid metallic ion source.

In addition, if the voltage applied to the emitter 22 is significantly large, the constituent element (tungsten or platinum) of the emitter 22 flies toward the extraction electrode 23 together with the Ar ions and thus the voltage applied to the emitter 22 is maintained at a voltage for disabling the constituent element of the emitter 22 itself to run out at the time of the operation (at the time of ion beam radiation).

The shape of the front end 22a can be adjusted by adjusting the constituent element of the emitter 22. For example, an element located at an uppermost end of the front end 22a is intentionally removed so as to widen a region for ionizing the gas such that the diameter of the ion beam can be increased. In addition, since the emitter 22 is heated such that the noble metal element of the surface thereof is rearranged without running out, the sharpened shape of the front end 22a which thickens by use can be recovered.

The ion optical system 25 includes, for example, a condenser lens for converging an ion beam, a diaphragm for narrowing the ion beam, an aligner for adjusting an optical axis of the ion beam, an objective lens for converging the ion beam to a sample, and a deflector for scanning the ion beam on the sample, sequentially from the gas field ion source 21 to the vacuum chamber 13.

In the ion beam irradiation system 20 having such a configuration, since a source size is 1 nm or less and the energy spread of the ion beam is 1 eV or less, the beam diameter can be narrowed to 1 nm or less.

As shown in FIGS. 1 and 2, the sample stage 16 movably supports a sample pedestal 14 on which the sample Wa is laid. The sample stage 16 may displace the sample pedestal 14 along two XY axes.

The inside of the vacuum chamber 13 can be depressurized to a predetermined vacuum degree, and the secondary charged particle detector 18 and the gas gun 11 are provided in the vacuum chamber 13. The secondary charged particle detector 18 detects the secondary electrons or the secondary ions generated from the sample Wa when the ion beam 20A is irradiated from the ion beam irradiation system 20 to the sample Wa.

The gas gun 11 emits one or more types of gases such as etching rate-increasing gas for increasing an etching rate of the etching using the ion beam 20A or light-shielding film material deposition gas for correcting a clear defect to the sample Wa. The type of the gas may be properly selected in each process according to the types of the defects to be corrected.

For example, the ion beam 20A is irradiated to the sample Wa while supplying the etching rate-increasing gas with a mass larger than that of the gas ions configuring the ion beam 20A from the gas gun 11 such that gas assist etching can be performed. Thus, the etching rate of the sample Wa can be increased compared with the case of using only the physical sputter of the ion beam 20A.

In addition, if the ion beam 20A is irradiated to the sample Wa while supplying the deposition gas from the gas gun 11, gas assist deposition can be performed. Thus, it is possible to form a deposit or a film of an insulating material or metal on the sample Wa.

The electron gun 19 for charge neutralization irradiates an electron beam to a region including an ion beam irradiation region so as to perform charge neutralization such that charge-up of a portion to be corrected is suppressed.

In addition, the defect correcting device 100 includes a control device 30 for controlling the components configuring this device. The control device 30 is electrically connected to the ion beam irradiation system 20, the secondary charged particle detector 18, and the sample stage 16. A display device 38 for displaying the sample Wa as an image based on the output of the secondary charged particle detector 18 is included.

The control device 30 comprehensively controls the defect correcting device 100 and includes at least an image acquiring unit for converting the output of the secondary charged particles 40 which are the secondary electrons or the secondary ions detected by the secondary charged particle detector 18 into a luminance signal so as to generate image data, and a display control unit for outputting the image data to the display device 38. Accordingly, the display device 38 can display the sample image as described above.

In addition, the control device 30 includes an image processing unit which performs image processing with respect to the generated image data, acquires and compares shape information of the sample Wa with, for example, normal shape information of the sample Wa, extracts a defect, and acquires defect information such as the type, the position and the size of the defect.

To this end, the control device 30 can analyze the shape of the sample Wa before and after correcting the defect using the output of the secondary charged particles 40 generated when the ion beam 20A is irradiated to the sample Wa. In addition, the control device 30 drives the sample stage 16 based on a command of software or an input of an operator and adjusts the position or the attitude of the sample Wa. Accordingly, the irradiation position of the ion beam 20A on the sample surface can be adjusted.

Next, the operation of the defect correcting device 100 will be described using an example of defect correction.

Figure 4A:
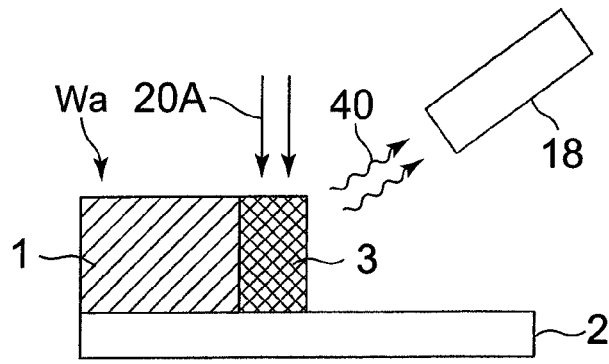
FIG. 4A is a process explanation view showing a section of a thickness direction in a defect correcting process of a opaque defect using the photomask defect correcting device according to the same embodiment.
Figure 4B:
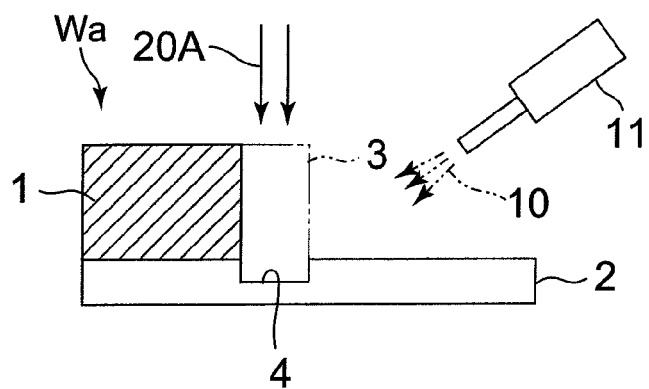
FIG. 4B is a process explanation view showing the section of the thickness direction in the defect correcting process of the same opaque defect.
Figure 4C:
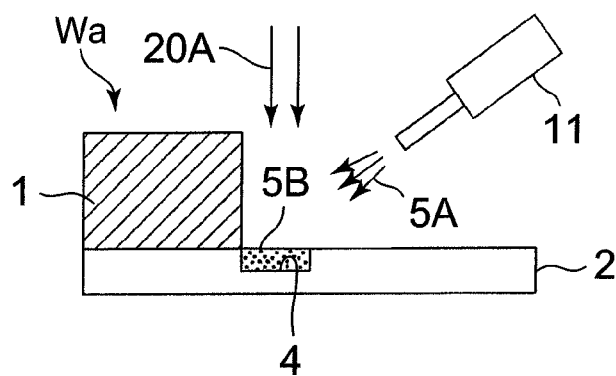
FIG. 4C is a process explanation view showing the section of the thickness direction in the defect correcting process of the same opaque defect.
Figure 5A:
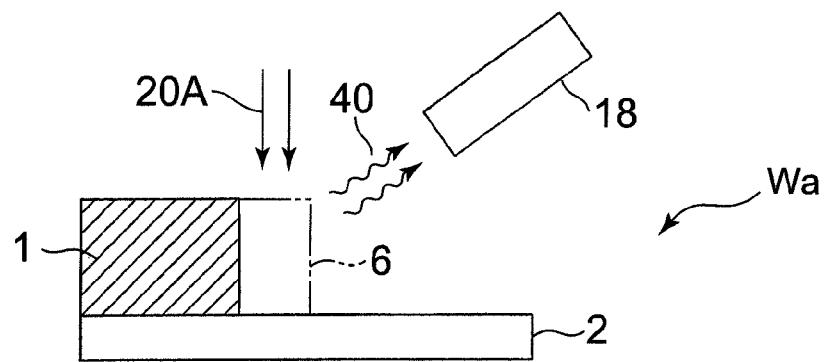
FIG. 5A is a process explanation view showing the section of the thickness direction in the defect correcting process of a clear defect using the photomask defect correcting device of an embodiment of the present invention.
Figure 5B:
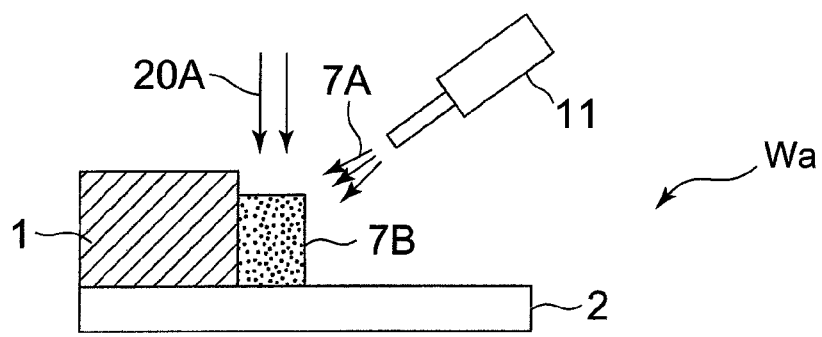
FIG. 5B is a process explanation view showing the section of the thickness direction in the defect correcting process of the same clear defect.
Figure 5C:
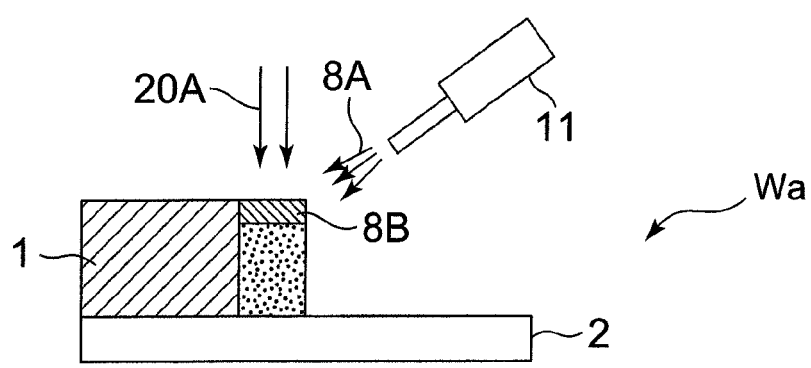
FIG. 5C is a process explanation view showing the section of the thickness direction in the defect correcting process of the same clear defect.
Figure 6A:
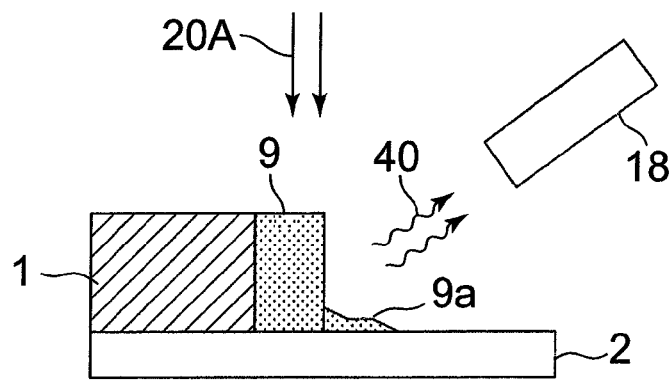
FIG. 6A is a process explanation view showing the section of the thickness direction in the defect correcting process of halo using the photomask defect correcting device according to an embodiment of the present invention.
Figure 6B:
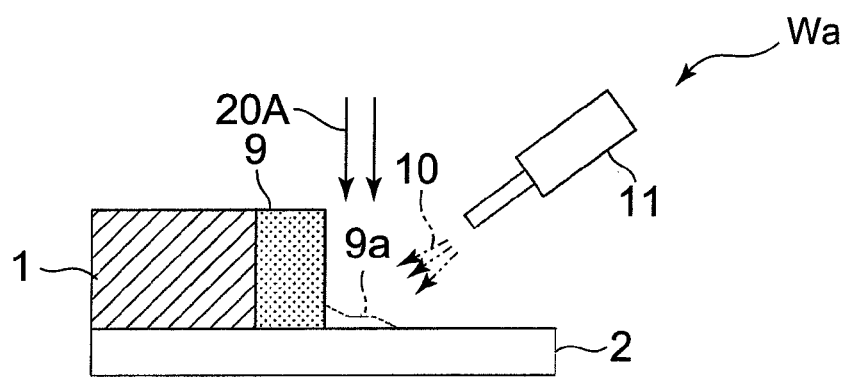
FIG. 6B is a process explanation view showing the section of the thickness direction of the defect correcting process of the same halo.
Figure 7A:
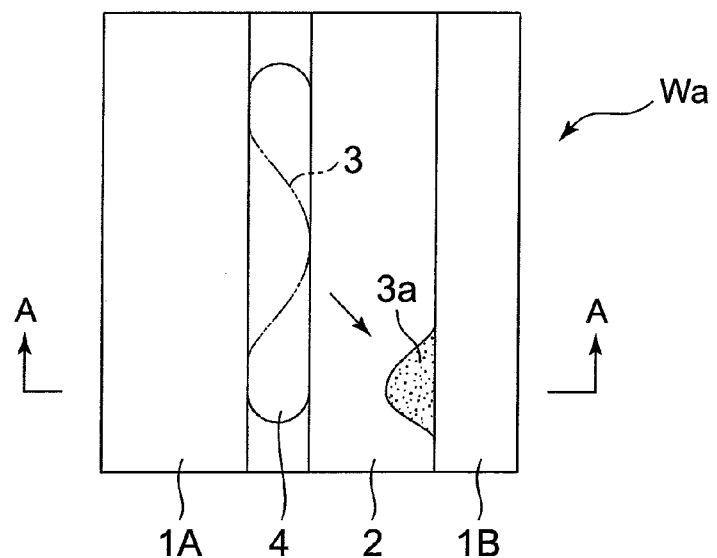
FIG. 7A is a plan view showing a state in which a reattachment portion is formed by the defect correcting process of the photomask defect correcting method according to an embodiment of the present invention.
Figure 7B:
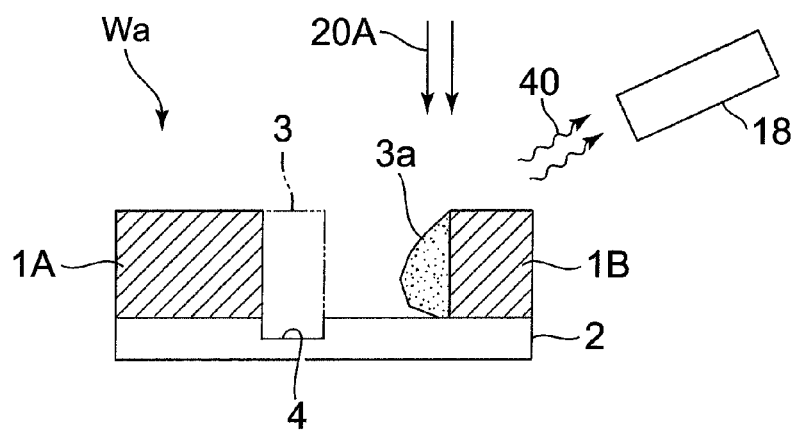
FIG. 7B is a cross-sectional view taken along line A-A of FIG. 7A.
Figure 8A:
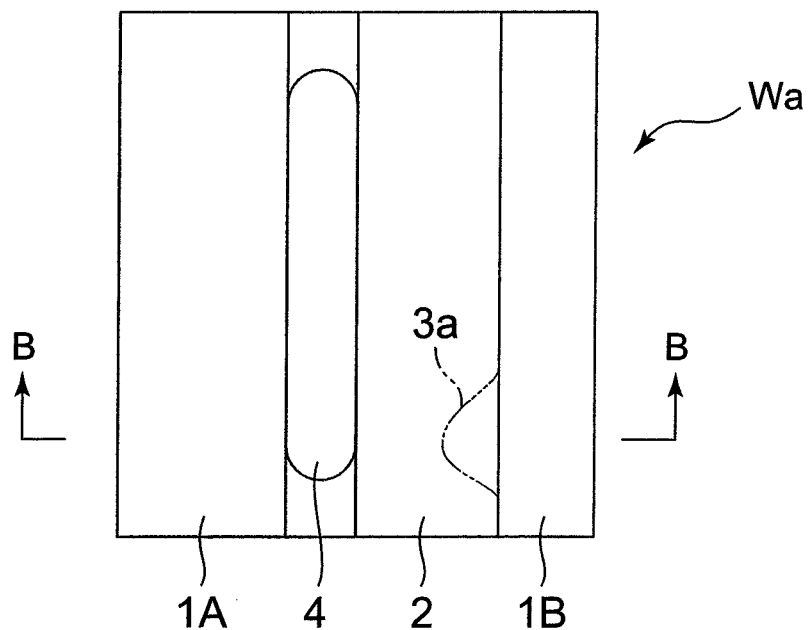
FIG. 8A is a plan view explaining a defect correcting process of removing a reattachment portion according to the photomask defect correcting method according to an embodiment of the present invention.
Figure 8B:
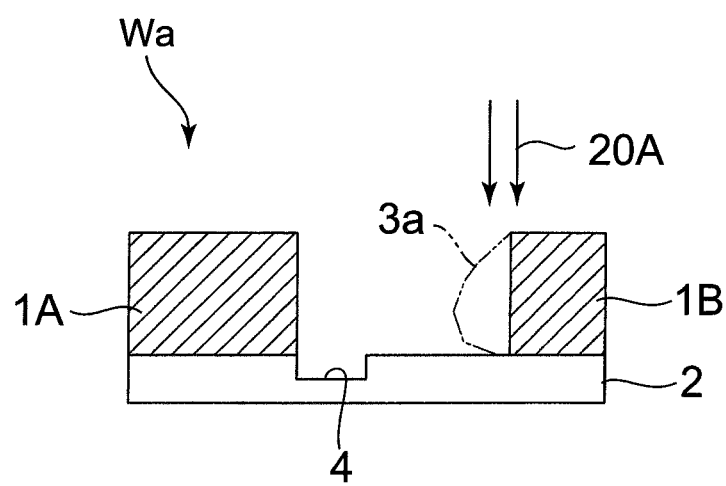
FIG. 8B is a cross-sectional view taken along line B-B of FIG. 8A.

FIGS. 4A to 4C are process explanation views showing a section of a thickness direction in a defect correcting process of a opaque defect using the photomask defect correcting device according to an embodiment of the present invention. FIGS. 5A to 5C are process explanation views showing the section of the thickness direction in the defect correcting process of a clear defect using the photomask defect correcting device of an embodiment of the present invention. FIGS. 6A and 6B are process explanation views showing the section of the thickness direction in the defect correcting process of halo using the photomask defect correcting device according to an embodiment of the present invention. FIGS. 7A and 7B are a plan view showing a state in which a reattachment portion is formed by the defect correcting process of the photomask defect correcting method according to an embodiment of the present invention and a cross-sectional view taken along line A-A thereof, respectively. FIGS. 8A and 8B are a plan view explaining a defect correcting process of removing a reattachment portion according to the photomask defect correcting method according to an embodiment of the present invention and a cross-sectional view taken along line B-B thereof, respectively.

In the defect correcting method using the defect correcting device 100 according to the present embodiment, an observation process of observing the defect of the sample Wa and acquiring defect information for performing correction, a gas selection process of selecting gas for correcting the defect of the sample Wa, for example, selecting the etching rate-increasing gas in an opaque defect and deposition gas in a clear defect based on the defect information acquired in the observation process, and a defect correcting process of correcting the defect is sequentially performed so as to perform defect correction one time. In addition, these processes are repeated one time or more according to the type or the size of the defect so as to correct the defect on the sample Wa.

In addition, this defect correcting process includes a process of correcting the defect generated in a process of manufacturing the sample Wa and correcting the defect newly generated in another defect correcting process of the present embodiment.

Embodiment 1

First, as shown in FIG. 4A, Embodiment 1 of a defect correcting method when an opaque defect 3 is formed on an end of the light-shielding film pattern portion 1 by attachment of dust or pattern abnormality of the light-shielding film pattern portion 1 in a sample Wa in which a light-shielding film pattern portion 1 is formed on a glass substrate 2, for example, by metal such as chrome (Cr), will be described. In Embodiment 1 (and Embodiments 2-4), the rare gas argon is selected as an example of the ion source gas; however, the present invention is not limited to using argon, and other ion source gases including the rare gases helium (He), neon (Ne), krypton (Kr) and xenon (Xe) as well as the non-rare gases hydrogen (H), nitrogen (N), oxygen (O), fluorine (F) and chlorine (Cl) may be used.

In the observation process, by the control device 30, in a state in which the gas supply from the gas gun 11 is stopped, the ion beam irradiation system 20 irradiates an ion beam 20A with the output of a degree that etching is not performed to the sample Wa (see FIG. 4A). Accordingly, secondary charged particles 40 are irradiated from the light shielding film pattern portion 1 and an opaque defect 3 onto which the ion beam 20A is irradiated, and the secondary charged particles 40 are detected by a secondary charged particle detector 18. The control device 30 acquires image data of the sample Wa based on the output of the secondary charged particle detector 18. Based on this image data, an image of the sample Wa is displayed on a display device 38.

In the control device 30, this image data is compared with image data of the light shielding film pattern portion 1 formed on the normal sample Wa so as to acquire defect information on the position and the size of the opaque defect 3. This image data is enlarged and displayed on the display device 38. To this end, an operator of the defect correcting device 100 can observe the opaque defect 3 and the state of the vicinity thereof using the display device 38.

Next, in the gas selection process, the control device 30 determines that the defect on the sample Wa is the opaque defect 3 from the acquired image data and selects the etching rate-increasing gas in order to rapidly remove the opaque defect 3. As the etching rate-increasing gas, for example, iodine ($I_2$) gas, xenon fluoride ($XeF_2$) gas or the like may be used.

However, in the present embodiment, since the ion beam 20A obtained by ionizing Ar gas with a relatively large mass is used, physical sputter can be performed using only the ion beam 20A and etching can be performed. Accordingly, if a sufficient etching rate is obtained, the etching rate-increasing gas may not be used. If a He ion having a small mass is used as a rare gas ion, the sample is hardly etched by only irradiating the ion beam to the sample. Thus, the etching rate-increasing gas needs to be used.

Next, in the defect correcting process, the irradiation position of the ion beam 20A on the opaque defect 3, which is a portion to be corrected, is moved by a sample stage 16 based on the defect information acquired in the observation process.

As shown in FIG. 4B, the ion beam 20A is irradiated toward the opaque defect 3 and the opaque defect 3 is etched while the irradiation position of the ion beam 20A is moved, if necessary. In order to remove the opaque defect 3 in the thickness direction with certainty, etching is performed until a groove 4 is formed at the side of the glass substrate 2.

In addition, if the etching rate-increasing gas is selected in the gas selection process, for example, if etching gas 10 denoted by a dashed-two dotted line of FIG. 4B is used as the etching rate-increasing gas, the irradiation of the ion beam 20A is performed while the etching gas 10 is supplied from the gas gun 11 to the vicinity of the opaque defect 3.

Since the beam diameter of the ion beam 20A can be narrowed to a minute diameter of 1 nm or less, processing resolution in plan view is high and only the range of the opaque defect 3 can be removed and processed. To this end, since the normal light-shielding film pattern portion 1 is not removed or a minute region thereof is removed, after removing the opaque defect 3, the effort of the processing of repairing the light-shielding film pattern portion 1 can be omitted and rapid defect correction can be performed.

The defect correcting process of removing the opaque defect 3 is completed.

Next, defect correction for depositing a transparent film in the groove 4 using the over-etched groove 4 as a portion to be corrected is performed. To this end, the observation process, the gas selection process and the defect correction process are sequentially performed under a condition different from the above description. Hereinafter, a difference from the above description will be described.

First, in the observation process, similar to the above description, the image data in the vicinity of the groove 4 is acquired and information on the repair range of the groove 4 is acquired as the defect information. In the gas selection process, deposition gas 5A (see FIG. 4C) for forming a transparent film having the substantially same transmissivity and refractive index as the glass material of the glass substrate 2 in the groove 4 by deposition is selected as the light-shielding film material gas.

As the deposition gas 5A, for example, silane-based or siloxane-based gas for forming a transparent film 5B by focused-ion-beam-induced chemical vapor deposition (FIB-CVD) may be employed.

Next, in the defect correction process, as shown in FIG. 4C, the ion beam 20A is irradiated onto the groove 4 while supplying the deposition gas 5A from the gas gun 11 to the vicinity of the groove 4, the irradiation position of the ion beam 20A is moved, if necessary, the transparent film 5B is deposited in the groove 4, and the groove 4 is filled.

The opaque defect 3 is removed from the sample Wa and, at this time, the groove 4 generated in the glass substrate 2 can be repaired by over-etching. Accordingly, the defect correction of the sample Wa is completed.

By these processes, the Ar ions configuring the ion beam 20A are injected into the glass substrate 2 or the transparent film 5B to some degree, but, for example, unlike the Ga ions or the like, the Ar ions which are rare gas ions do not absorb light having a wavelength of 193 nm and thus the optical characteristics of the glass substrate 2 repaired by the transparent film 5B can be properly maintained.

In addition, the Ar ion beam is irradiated in the defect correction process, the sample Wa is positively charged up. Therefore, simultaneous with the above-described defect correction process or after the defect correction process, the electron beam is preferably irradiated from the electron gun 19 to the sample Wa so as to perform charge neutralization.

From this point, in the related art in which the electron beam is irradiated so as to perform defect correction, since the sample Wa is negatively charged up, a positive ion beam is irradiated so as to perform charge neutralization. However, if positive ions having a large molecular weight are irradiated, the sample Wa is excessively trimmed by sputter effect. In contrast, in the present invention in which the electron beam is irradiated so as to perform charge neutralization, it is possible to prevent the sample Wa from being excessively trimmed.

Embodiment 2

Next, as shown in FIG. 5A, Embodiment 2 of a defect correcting method in the case where a clear defect of halftone type phase shift is corrected will be described concentrating on a difference with Embodiment 1.

In the observation process, as shown in FIG. 5A, similar to Embodiment 1, the defect information such as the position and the size of the clear defect 6 is acquired. In addition, this image data is enlarged and displayed on the display device 38.

Next, the gas selection process for opaque defect correction or clear defect correction, from the acquired image data, the control device 30 determines that the configuration of the clear defect 6 is the loss of the halftone phase shift film and selects the light-shielding film material gas for sequentially depositing films such as a transparent phase film and a light-shielding film. For example, deposition gas 7A formed of the same material as the deposition gas 5A is selected for the transparent phase film and, for example, deposition gas 8A such as naphthalene or phenanthrene which is carbon-based gas is selected for the light-shielding film.

Next, in the defect correcting process, as shown in FIG. 5B, the ion beam 20A is irradiated onto the glass substrate 2 at the position of the clear defect 6 while supplying the deposition gas 7A from the gas gun 11 to the vicinity of the position of the clear defect 6 which is the portion to be corrected, and a transparent phase film 7B is deposited in the range of the clear defect 6 while moving the irradiation position of the ion beam 20A if necessary. The transparent phase film 7B is formed with a thickness for obtaining a necessary phase shift amount, for example, a phase shift amount of 180°.

After forming the transparent phase film 7B, as shown in FIG. 5C, the gas supplied from the gas gun 11 is switched to the deposition gas 8A. While the deposition gas 8A is supplied to the vicinity of the clear defect 6, the ion beam 20A is irradiated onto the transparent phase film 7B so as to deposit the light-shielding film 8B. The light-shielding film 8B is formed, for example, with a thickness for obtaining a halftone film having transmissivity of 6%.

Therefore, the clear defect 6 of the sample Wa can be repaired. Accordingly, the defect correction of the sample Wa is completed.

In the present embodiment, since gas ions which do not absorb light having the wavelength of 193 nm are used in the ion beam 20A, the optical characteristics of the transparent phase film 7B and the light-shielding film 8B do not deteriorate and thus a halftone phase shift film having good optical characteristics can be formed.

Embodiment 3

Next, as shown in FIG. 6A, Embodiment 3 of a defect correcting method in the case where a halo 9a is generated on the glass substrate 2 outside a range to be corrected when a defect correction film 9 is formed in an end of the light-shielding film pattern portion 1 in the sample Wa in which the light-shielding film pattern portion 1 is formed on the glass substrate 2 will be described concentrating on a difference with Embodiment 1.

The halo 9a is generated as the defect correction result of forming the defect correction film 9, but becomes a new defect because the optical characteristics (transmissivity) of the glass substrate 2 deteriorate.

First, as shown in FIG. 6A, after the defect correction film 9 is formed, similar to Embodiment 1, the observation process is performed such that the defect information such as the position and the size of the halo 9a is acquired. In addition, this image data is enlarged and displayed on the display device 38.

Next, the gas selection process for opaque defect correction or clear defect correction, from the acquired image data, the control device 30 determines that the defect on the sample Wa is the halo 9a and selects the gas for opaque defect correction in order to remove the halo 9a by etching, similar to Embodiment 1. Alternatively, if the halo 9a is removed using only the ion beam by etching, the gas is not selected.

Next, in the defect correction process, as shown in FIG. 6B, similar to the etching of the opaque defect 3 of Embodiment 1, the halo 9a is etched. In particular, although not shown, when the same groove 4 as Embodiment 1 is formed by over-etching, refilling correction is performed similar to Embodiment 1.

Therefore, the halo 9a of the sample Wa can be repaired. Accordingly, the defect correction of the sample Wa is completed.

In the present embodiment, since gas ions which do not absorb the light having the wavelength of 193 nm are used in the ion beam 20A, the optical characteristics of the defect correction film 9 or the glass substrate 2 are good.

Embodiment 4

Next, as shown in FIGS. 7A and 7B, Embodiment 4 of a defect correcting method in the case where a reattachment portion 3a is formed by reattaching the component of the opaque defect 3 on the side surface of the light-shielding film pattern portion 1B of the opposite side as the result of correcting the opaque defect 3 of the end of the light-shielding film pattern portion 1A in the sample Wa in which line-shaped light-shielding film pattern portions 1A and 1B are formed on the glass substrate 2 with a gap interposed therebetween by, for example, metal such as Cr will be described concentrating on a difference with Embodiment 1.

The reattachment portion 3a is generated as the defect correction result of removing the opaque defect 3, but becomes a new defect because it is pulled out from the light-shielding film pattern portion 1B to the space between the light-shielding film pattern portions 1A and 1B so as to deteriorate the optical characteristics of the photomask.

First, in the observation process, as shown in FIGS. 7A and 7B, similar to Embodiment 1, the defect information such as the position and the size of the reattachment portion 3a is acquired. In addition, this image data is enlarged and displayed on the display device 38.

Next, the gas selection process for opaque defect correction or clear defect correction, from the acquired image data, the control device 30 determines that the defect on the sample Wa is the reattachment portion 3a which is one type of the opaque defect 3 and selects the gas for opaque defect correction in order to remove the reattachment portion 3a by etching, similar to Embodiment 1. Alternatively, if the reattachment portion 3a is removed using only the ion beam by etching, the gas is not selected.

Next, in the defect correction process, as shown in FIGS. 8A and 8B, similar to the etching of the opaque defect 3 of Embodiment 1, the reattachment portion 3a which is a portion to be corrected is etched. In the example of the shown reattachment portion 3a, the reattachment portion 3a is attached to the side surface of the light-shielding film pattern portion 1B and thus can be removed without performing over-etching.

Even a plurality of reattachment portion 3a is generated, the irradiation position of the focused ion beam is moved to the respective positions acquired in the observation process and the removal is similarly performed.

Therefore, the reattachment portion 3a of the sample Wa can be removed. If the groove 4 is formed when removing the opaque defect 3, the correction for refilling the groove 4 is performed.

Accordingly, the defect correction of the sample Wa is completed.

The reattachment portion 3a is an opaque defect smaller than the opaque defect 3 since a material of some of the opaque defect 3 is reattached. However, in the present embodiment, since the beam diameter of the ion beam 20A can be narrowed to a minute diameter of 1 nm or less, it is possible to remove the reattachment portion 3a without substantially removing the normal portion of the light-shielding film pattern portion 1B.

According to the photomask defect correction device using the defect correction device 100 of the present embodiment, since the defect correction is performed by irradiating the ion beam 20A formed of gas ions to the sample Wa by the ion beam irradiation system 20 including the gas field ion source 21, it is possible to correct the defect of the photomask by the ion beam 20A having a minute diameter with high precision. In addition, since the transmissivity of the sample Wa does not deteriorate by the irradiation of the ion beam 20A, it is suitable for the photomask defect correction requiring the good optical characteristics in the light transmission portion. For example, since a process of removing an injection portion does not need to be performed as the case where the Ga ion beam is used, it is possible to rapidly perform defect correction.

Modified Example

Figure 9:
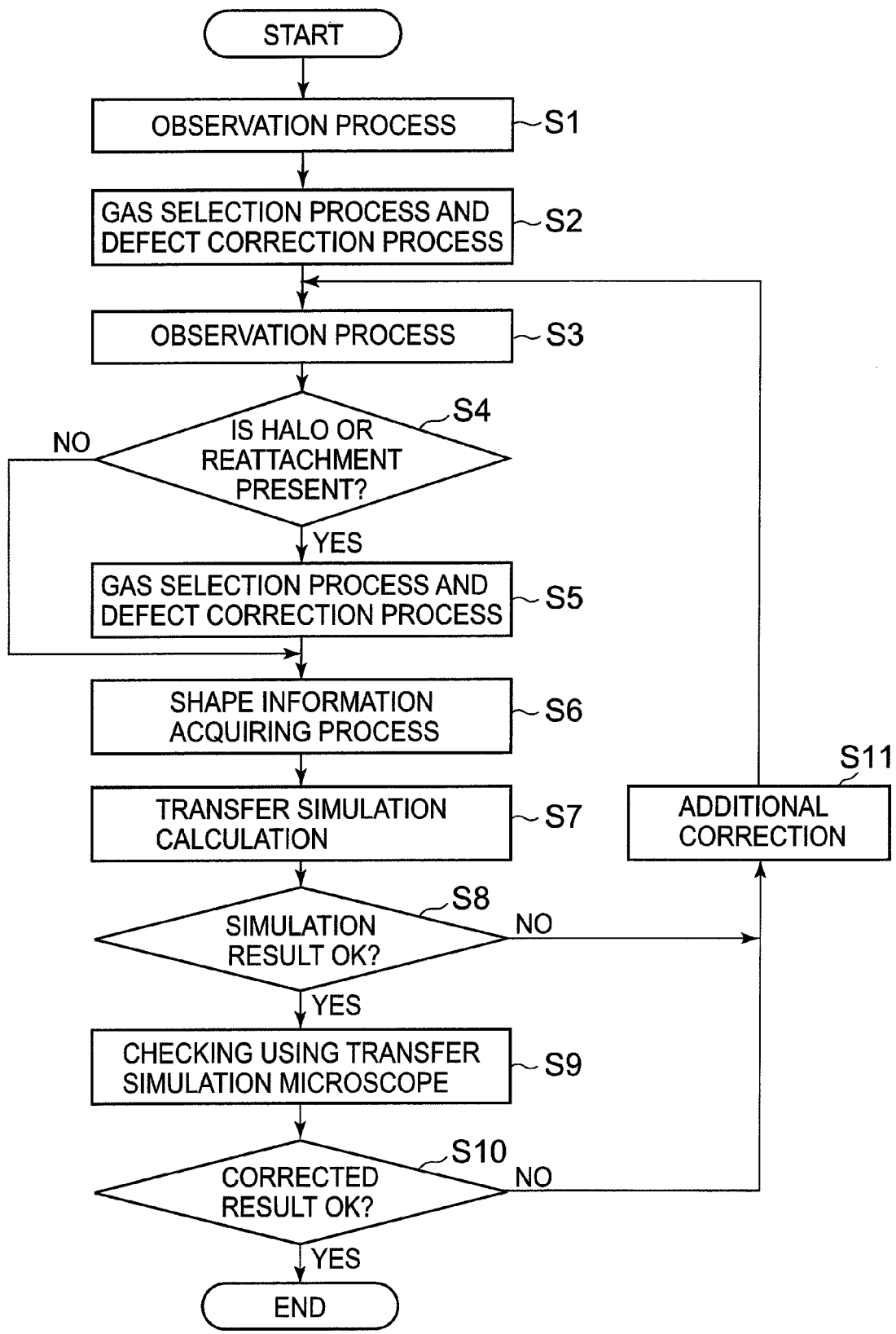
FIG. 9 is a flowchart illustrating processes of a photomask defect correcting method according to a modified example of the above embodiment.

Next, a modified example of the present embodiment will be described. FIG. 9 is a flowchart illustrating processes of a photomask defect correcting method according to a modified example of the embodiment of the present invention.

In the defect correction of the photomask, in the related art, a transfer simulation microscope (for example, AIMS (registered trademark) or the like manufactured by CARLZEISS. Co., Ltd.) for simulating a transferred result based on an actual exposure condition is used as means for evaluating the corrected result. However, it takes much time to perform the movement of the sample Wa or alignment, measurement, and analysis of the sample Wa in the transfer simulation microscope and thus a time necessary for the overall photomask defect correction process is increased.

The defect correction method of the present modified example reduces the number of times of measurement using the transfer simulation microscope so as to rapidly perform the defect correction.

In the defect correction method of the present modified example, similar to the above description, according to the defect of the sample Wa, after an observation process, a gas selection process for opaque defect correction or clear defect correction, and a defect correcting process are sequentially repeated one time or more, a shape information acquiring process of acquiring shape information on a portion to be corrected and a transfer simulation process of performing transfer simulation based on numerical calculation from the shape information on the portion to be corrected acquired in the shape information acquiring process and determining whether the correction is properly performed are included. The observation process, the gas selection process for opaque defect correction or clear defect correction, and the defect correcting process are sequentially repeated until it is determined that the correction is properly performed by the transfer simulation process, and the shape of the portion to be corrected is checked by the transfer simulation microscope if it is determined that the correction is properly performed by the transfer simulation process.

In order to achieve this method, in the control device 30 of the defect correction device 100, a modification in which the transfer simulation unit which acquires the shape information of the sample Wa from the image data of the sample Wa acquired by the image acquiring unit, performs a transfer simulation calculation based on the shape information, and determines whether the correction of the sample Wa is properly performed is further included is made.

An example of the defect correction method of the present modified example will be described with reference to FIG. 9.

In step S1, the observation process is performed with respect to the sample Wa.

Next, in step S2, it is determined whether the defect is the opaque defect 3 or the clear defect 6 based on the observed result of step S1 so as to select the gas to be supplied to the portion to be corrected, and the defect correction process corresponding to the etching and the deposition is performed using the rare gas ion beam 20A obtained from the gas field ion source 21.

That is, in step S1 and S2, the same defect correction as Embodiments 1 and 2 is performed.

Next, in step S3, the observation process is performed using the ion beam 20A with respect to the sample Wa after the defect correction of step S2.

In addition, in step S4, it is determined whether the halo or the reattachment portion is present in the sample Wa based on the observed result of step S3, and the process progresses to step S6 if the halo or the reattachment portion is not present.

In addition, if the halo or the reattachment portion is present, the process progresses to step S5.

In step S5, the gas selection process for opaque defect correction or clear defect correction for performing the defect correction corresponding to the halo or the reattachment portion and the defect correction process using the ion beam 20A are performed based on the observed result of step S3.

That is, the same defect correction as Embodiments 3 and 4 is performed in steps S3 and S5.

Next, in step S6, the shape information on the sample Wa after the defection correction of step S2 or S5 is acquired. The present process, similar to the observation process, the image data of the sample Wa is acquired by the image acquiring unit of the control device 30, and image processing is performed by the transfer simulation unit of the control device 30 so as to acquire the shape information on the sample Wa necessary for the transfer simulation calculation. That is, step S6 configures the shape information acquiring process.

At this time, in the sample Wa, the defect observed in step S1 is corrected and a new detect is not generated due to the defect correction of step S2. Even when the new defect is generated, the new defect is substantially removed in step S5. Since the beam diameter of the ion beam 20A is minute, the defect correction can be performed with high precision. Accordingly, the shape information acquired in step S6 is in a state in which a pattern shape close to a normal pattern is applied.

Next, in step S7, the transfer simulation calculation is performed based on the shape information acquired in step S6. In detail, a numerical calculation model of the sample Wa is created based on the mask shape information after correction, and numerical calculation of the exposure characteristics (light transmissivity of the portions of the mask) under an assumed exposure condition is performed so as to calculate a transfer image.

Next, in step S8, it is determined whether the transfer image is in an allowable range. That is, with respect to a transfer image (light intensity distribution) of a defect correction portion and a transfer image (light intensity distribution) of a normal portion without defect, a transferred linewidth is calculated and compared using the light intensity corresponding to resist sensitivity as a threshold and it is determined that the transfer image is in the allowable range if a variation in linewidth is within 5% or 10%.

In addition, it is determined that the transfer image is in the allowable range, the process progresses to step S9.

Here, steps S7 and S8 configure the transfer simulation process of the present modified example.

In step S9, the photomask of the sample Wa is measured by the transfer simulation microscope. In detail, a laser is irradiated onto an actual mask so as to observe a transferred image. In step S10, the measured result is determined and the defection correction is completed if yes. If no, the process progresses to step S11.

In step S11, additional process of correcting the defect again is performed with respect to a portion which does not satisfy the allowable value of the sample Wa as the result of step S7 or S9. After the additional processing is finished, the process progresses to step S3 and the above processes are repeated.

According to the photomask defect correction method using the transfer simulation of the present modified example, in the observation or defect correction process, since gas ions which do not deteriorate the transmissivity of the light transmission portion even when being injected into the light transmission portion are used, a countermeasure against the optical characteristics is good, the right optical characteristics can be predicted even when the transfer simulation calculation is performed from only the image after processing, and a degree of completion of the defect correction can be increased by approaching a normal pattern shape. That is, since an ion beam configured of argon ions, or of helium, neon, krpton, xenon, hydrogen, nitrogen, oxygen, fluorine or chlorine ions, is used, the ions which reduce the transmissivity, such as Ga ions, are not injected. Therefore, additional processing can be repeated so as to approach the normal pattern shape. As a result, in the defect correction process of the sample Wa, since the number of times of measurement using the transfer simulation microscope can be reduced, it is possible to shorten time consumed for the overall process of the defection correction.

Meanwhile, in the case where the ion beam obtained from the Ga liquid metal ion source of the related art is used, due to the deterioration of the transmissivity by the injection of the Ga ions, the optical characteristics may be bad even when correction to a correct pattern shape is performed. Even when additional processing is performed, the optical characteristics necessary for a corrected point cannot be obtained unless additional processing is performed based on the data measured by the transfer simulation microscope not but based on the shape information. Even when correction to a right pattern shape is performed, the number of times of measurement using the transfer simulation microscope is increased.

That is, in the related art for irradiating the Ga ion beam so as to perform defect correction, since the transmissivity of the mask deteriorates due to the Ga ion injection, even when the opaque defect is accurately trimmed, an actual transferred image does not become a right shape. To this end, the actual transferred image approaches the right shape by excessively trimming the opaque defect. In the related art, an error between a transferred image calculated by the transfer simulation based on the numerical calculation using the shape information obtained from the image of the focused ion beam and the actual transferred image is increased. To this end, the transfer simulation cannot be used and it needs to be determined whether or not the correction is properly determined using the transfer simulation microscope at the time of the defect correction. In the transfer simulation microscope, it takes much time to perform the alignment of the mask or the like and, as a result, time consumed for performing the correction of the mask is increased.

In contrast, in the present invention in which, for example, an Ar ion beam is irradiated so as to perform defect correction, since the transmissivity of the mask does not deteriorate even when the Ar ions are injected, the shape of the mask and the shape of the actual transferred image coincide with each other. To this end, an error between the transferred image calculated by the transfer simulation based on the numerical calculation and the actual transferred image is decreased. Accordingly, it is possible to determine whether or not the correction is properly performed. Accordingly, since the transfer simulation microscope may not be used in all the defect correction processes, it is possible to rapidly perform the defection correction.

Although, in the above description, the case where the image of the portion to be corrected is acquired by the secondary charged particles which are the secondary electrons or the secondary ions radiated from the portion to be corrected when the focused ion beam is irradiated in the observation process and the shape information acquiring process is described, for example, observation means different from the focused ion beam, such as a scanning type electron microscope, may be used.

According to the photomask defect correction method and device of the present invention, since the focused ion beam formed of rare gas ions or of hydrogen, nitrogen, oxygen, fluorine or chlorine ions is irradiated to the portion to be corrected by the ion beam irradiation system including the gas field ion source so as to perform the defect correction, the following effects are obtained. The transmissivity of the portion to be corrected does not deteriorate by the irradiation of the focused ion beam. To this end, since the ion injection portion does not need to be removed in processing afterwards, it is possible to rapidly perform the correction. In addition, since the beam spot diameter is small, it is possible to perform the correction with high precision.

I claim:

1. A photomask defect correction method for correcting a defect of a photomask, the defect correction method comprising:
    an observation process of observing a defect in a portion of a photomask to be corrected and acquiring information of the observed defect for performing correction of the defect; and
    a defect correction process of correcting the observed defect in accordance with the acquired defect information by irradiating the observed defect with a focused ion beam generated by an ion beam irradiation system having a gas field ion source that generates gas ions for forming the focused ion beam,
    wherein the gas ions are selected from the group consisting of hydrogen ions, nitrogen ions, oxygen ions, fluorine ions, and chlorine ions.

2. A photomask defect correction method according to claim 1; wherein the gas ions are oxygen ions.

3. A photomask defect correction method according to claim 1; wherein the gas ions are nitrogen ions.

4. A photomask defect correction device for correcting a defect of a photomask using a focused ion beam, the defect correction device comprising:
    an ion beam irradiation system for irradiating a focused gas ion beam toward a portion of a photomask to be corrected, the ion beam irradiation system having a gas field ion source that generates gas ions for forming the focused ion beam;
    a gas supply system for supplying to a vicinity of the portion of the photomask to be corrected one of an etching rate-increasing gas for correcting an opaque defect of the portion of the photomask to be corrected and a light-shielding film material gas for correcting a clear defect of the portion of the photomask to be corrected;
    a detector that detects secondary charged particles emitted from the portion of the photomask to be corrected by the irradiation of the focused gas ion beam from the ion beam irradiation system; and
    an image acquiring unit that acquires an image of the portion of the photomask to be corrected based on the detection by the detector.

5. A photomask defect correction device according to claim 4; further comprising an electron beam irradiation unit for irradiating an electron beam to the portion of the photomask to be corrected to perform charge neutralization.

6. A photomask defect correction device according to claim 4; further comprising a transfer simulation unit for acquiring shape information on the portion of the photomask to be corrected from the image of the portion of the photomask to be corrected acquired by the image acquiring unit, for performing transfer simulation calculation based on the shape information, and for determining whether or not the correction of the portion of the photomask to be corrected is properly performed.

7. A photomask defect correction device according to claim 4; wherein the gas field ion source generates non-rare gas ions.

8. A photomask defect correction device according to claim 4; wherein the gas field ion source generates gas ions selected from the group consisting of hydrogen ions, nitrogen ions, oxygen ions, fluorine ions, and chlorine ions.

9. A photomask defect correction device according to claim 4; wherein the gas field ion source generates oxygen gas ions.

10. A photomask defect correction device according to claim 4; wherein the gas field ion source generates nitrogen gas ions.

* * * * *